United States Patent
Baker et al.

(10) Patent No.: US 7,271,635 B2
(45) Date of Patent: Sep. 18, 2007

(54) METHOD AND APPARATUS FOR REDUCING DUTY CYCLE DISTORTION OF AN OUTPUT SIGNAL

(75) Inventors: R. Jacob Baker, Meridian, ID (US); Timothy B. Cowles, Boise, ID (US)

(73) Assignee: Micron Technology, Boise, ID (US)

( * ) Notice: Subject to any disclaimer, the term of this patent is extended or adjusted under 35 U.S.C. 154(b) by 27 days.

(21) Appl. No.: 10/891,535

(22) Filed: Jul. 15, 2004

(65) Prior Publication Data

US 2006/0012412 A1 Jan. 19, 2006

(51) Int. Cl.
*H03K 3/017* (2006.01)
(52) U.S. Cl. ........................... 327/175; 327/172
(58) Field of Classification Search ........ 327/172–175, 327/50–52, 56
See application file for complete search history.

(56) References Cited

U.S. PATENT DOCUMENTS

| | | | | |
|---|---|---|---|---|
| 4,626,713 A | * | 12/1986 | Lee | 327/328 |
| 4,634,890 A | * | 1/1987 | Lee | 327/319 |
| 5,397,945 A | * | 3/1995 | Shum et al. | 327/77 |
| 5,477,180 A | * | 12/1995 | Chen | 327/175 |
| 5,907,254 A | * | 5/1999 | Chang | 327/165 |
| 6,084,452 A | * | 7/2000 | Drost et al. | 327/175 |
| 6,198,322 B1 | * | 3/2001 | Yoshimura | 327/175 |
| 6,424,178 B1 | * | 7/2002 | Harrison | 326/93 |
| 6,472,918 B1 | * | 10/2002 | Mosinskis et al. | 327/175 |
| 6,549,081 B1 | * | 4/2003 | Le et al. | 331/57 |
| 6,771,136 B1 | * | 8/2004 | Reynolds | 331/74 |
| 6,774,692 B2 | * | 8/2004 | Kim et al. | 327/172 |
| 6,915,442 B2 | * | 7/2005 | Wynen et al. | 713/500 |
| 6,933,759 B1 | * | 8/2005 | Wu et al. | 327/172 |
| 6,940,327 B2 | * | 9/2005 | Miki et al. | 327/172 |

* cited by examiner

*Primary Examiner*—Kenneth B. Wells
*Assistant Examiner*—Hai L. Nguyen
(74) *Attorney, Agent, or Firm*—Fletcher Yoder

(57) ABSTRACT

A method and apparatus for reducing the duty cycle distortion of a periodic signal in high speed devices. More specifically, there is provided a device having a switching point modulation circuit coupled to input logic and configured to modulate the periodic output signal from the input logic such that the periodic output signal is centered about a known voltage signal, such as a switching point voltage signal.

13 Claims, 3 Drawing Sheets

METHOD AND APPARATUS FOR REDUCING DUTY CYCLE DISTORTION OF AN OUTPUT SIGNAL

BACKGROUND OF THE INVENTION

1. Field of the Invention

The present invention relates generally to high speed devices and, more particularly, to techniques for reducing duty cycle distortion of signals in high speed devices.

2. Description of the Related Art

This section is intended to introduce the reader to various aspects of at which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Advances in technology in fabricating integrated circuit devices and systems have resulted in devices that operate at higher speeds than ever before. High speed devices such as processors, memory devices, communication circuits, data transmission systems and other high speed digital devices have provided users with the ability to work more efficiently. However, by implementing high speed designs to provide faster devices and faster signals, additional problems and considerations may arise.

As will be appreciated, faster signals generally correspond to narrower windows of time in which certain events may occur, such as triggering other signals or capturing data. For instance, a system clock may be implemented to clock an output signal when the signal is logically high and then again, when the signal is logically low. With increased signal speed, the timing for sampling the signal while it is logically high or logically low is reduced. Any distortion in the signal due to slow slewing of the signal may result in a distorted duty cycle, thereby reducing the sampling time even further. This may be particularly true for high speed applications. Thus, duty cycle distortion may result in undesirable device functionality, especially in devices implementing high speed designs.

The present invention may address one or more of the problems set forth above.

BRIEF DESCRIPTION OF THE DRAWINGS

The foregoing and other advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

One of the major problems in high speed design is ensuring that duty cycle distortion does not create timing problems for high speed signals. In accordance with embodiments of the present invention, a periodic signal of a logical device is compared to a known voltage signal. By adjusting the periodic signal such that it is centered about a reference, duty cycle distortion caused from slow slewing input signals in high speed devices may be reduced or eliminated. This provides a robust technique for avoiding duty cycle distortion by adjusting the periodic signal about a known voltage during operation such that power supply variations, temperature variations and process shifts do not adversely affect the signal. The presently described embodiments may be implemented in conjunction with any high speed devices, such as processors, communication circuits, memory devices, data transmission systems or other digital devices. Generally speaking, the present techniques are implemented such that the amplitude of an output voltage signal is centered about the known voltage, such as a switching point voltage, as described further below.

Figure 2:
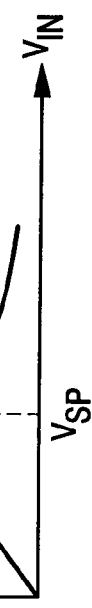
FIG. 2 is a graphical illustration of the signals associated with the exemplary inverter of FIG. 1.
Figure 1:
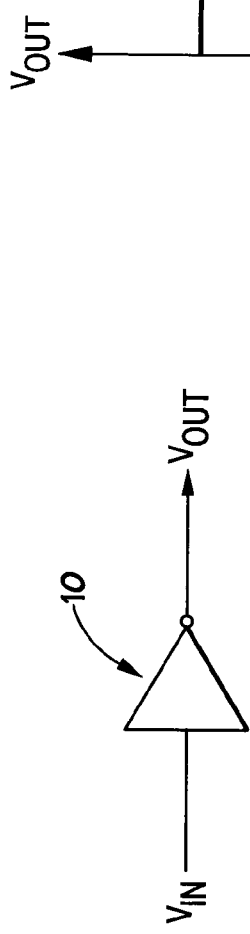
FIG. 1 illustrates a schematic diagram of an exemplary inverter which may be implemented in conjunction with the present techniques.
Figure 3:
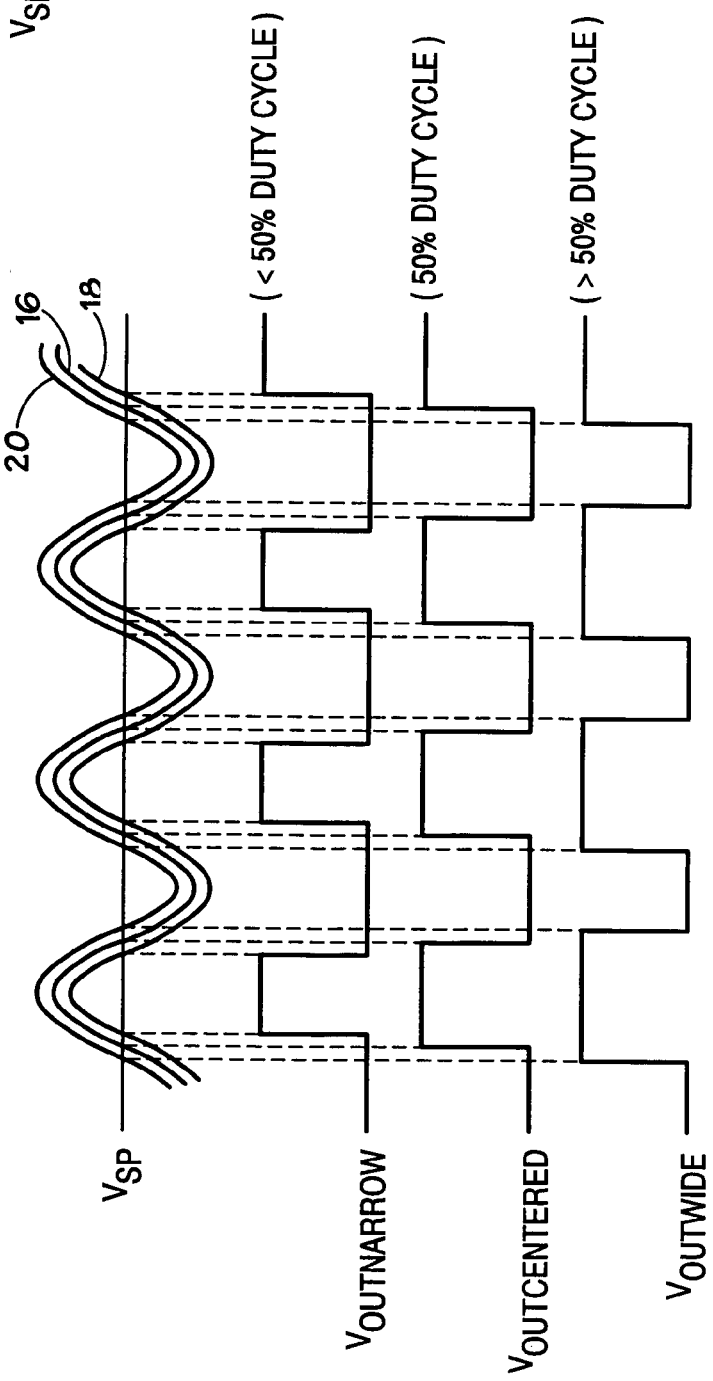
FIG. 3 illustrates a series of timing diagrams illustrating various waveforms and their corresponding duty cycles.

FIGS. 1-3 generally illustrate the presently described concept of switching an output signal about a known reference signal, such as the switching point voltage $V_{SP}$, for instance. It is generally desirable to modulate the output of logical gates such that the output signal is centered about a known point thereby optimizing the ability to sample or clock a particular output signal at its peak. Further, by centering the output signal about a fixed reference, duty cycle distortion may be reduced or eliminated.

FIG. 1 generally illustrates an inverter 10, which receives an input signal, such as an input voltage signal $V_{INPUT}$, and produces an output voltage signal $V_{OUTPUT}$. The switching point voltage $V_{SP}$ of the inverter 10 may be implemented to provide a reference voltage signal such that a periodic signal (discussed further below with reference to FIGS. 3-6) may be centered about the switching point voltage $V_{SP}$. As will be appreciated, the output voltage signal $V_{OUTPUT}$ may be plotted versus the input voltage signal $V_{INPUT}$, as illustrated by trace 12 in FIG. 2. The switching point voltage $V_{SP}$ is the voltage at which the output voltage signal $V_{OUTPUT}$ and the input voltage signal $V_{INPUT}$ are equal, as illustrated by reference numeral 14. Because the switching point voltage $V_{SP}$ of the inverter 10 is known, this value may be used as a reference point voltage about which a periodic output signal may be centered, to maximize each of the peak and valley of the periodic signal without negatively impacting one another. That is to say that by centering a periodic signal about the switching point voltage signal $V_{SP}$, a waveform having a 50% duty cycle may be achieved, thereby reducing the problems associated with slow slewing devices.

FIG. 3 illustrates three periodic waveform signals 16, 18 and 20 relative to a switching point voltage signal $V_{SP}$ to further illustrate the presently described concepts. As previously described, in many applications, it may be desirable to center a periodic signal about a reference voltage, such as the switching point voltage $V_{SP}$, to provide a 50% duty cycle for the the periodic signal. A periodic waveform centered about the voltage switching point $V_{SP}$ is generally illustrated by the reference number 16. The periodic waveform 16 having a 50% duty cycle may be converted (using additional logic) to a square waveform $V_{OUTCENTERED}$, having a 50% duty cycle. As will be appreciated, a 50% duty cycle generally provides a waveform having peaks and valleys of the same relative time, thereby maximizing each of the peaks and valleys without unfairly reducing one or the other.

In contrast, the waveforms generally illustrated by reference numerals 18 and 20 indicate periodic signals which are not centered around the voltage switching point $V_{SP}$. For instance, the output waveform 18 provides will provide a square waveform having narrow peaks, as generally indicated by the square waveform $V_{OUTNARROW}$. As will be appreciated, the square waveform $V_{OUTNARROW}$ has a duty cycle of less than 50%. Accordingly, the time that the signal is logically high is reduced which may disadvantageously minimize the amount of time in which certain switching functions and sampling instances may take place while the output voltage $V_{OUTNARROW}$ is logically high. Conversely, the output waveform 20 provides a square waveform having a greater than 50% duty cycle, as generally indicated by the square waveform $V_{OUTWIDE}$. As will be appreciated, the time at which the output voltage signal $V_{OURWIDE}$ is logically low is minimized thereby reducing the amount of time in which certain switching functions and sampling instances may take place while the output voltage $V_{OUTWIDE}$ is logically low.

Figure 4:
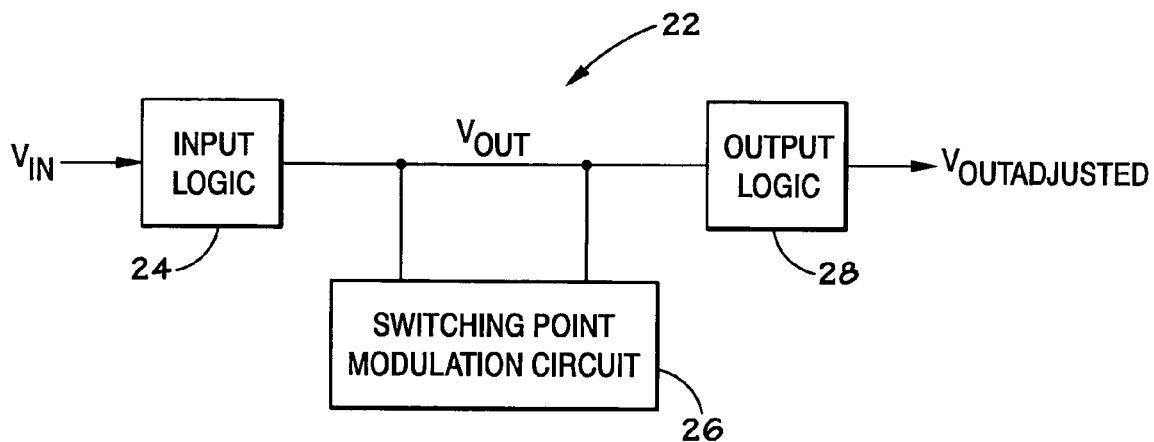
FIG. 4 illustrates a block diagram of a device in accordance with embodiments of the present techniques.

FIG. 4 is a block diagram of a portion of a high speed device 22 in accordance with embodiments of the present invention. Input logic 24 is generally configured to receive a periodic input signal, such as an input voltage signal $V_{IN}$, and to produce a periodic output signal, such as an output voltage signal $V_{OUT}$. The switching point modulation circuit 26 may be implemented to adjust the output voltage signal $V_{OUT}$ to produce a modulated or adjusted output voltage $V_{OUTADJUSTED}$, such that it swings (e.g. is centered) about a known reference voltage. Depending on the type of waveform of the output voltage $V_{OUT}$, output logic 28 may be provided to generate a full logic signal, as will be appreciated by those skilled in the art.

Figure 5:
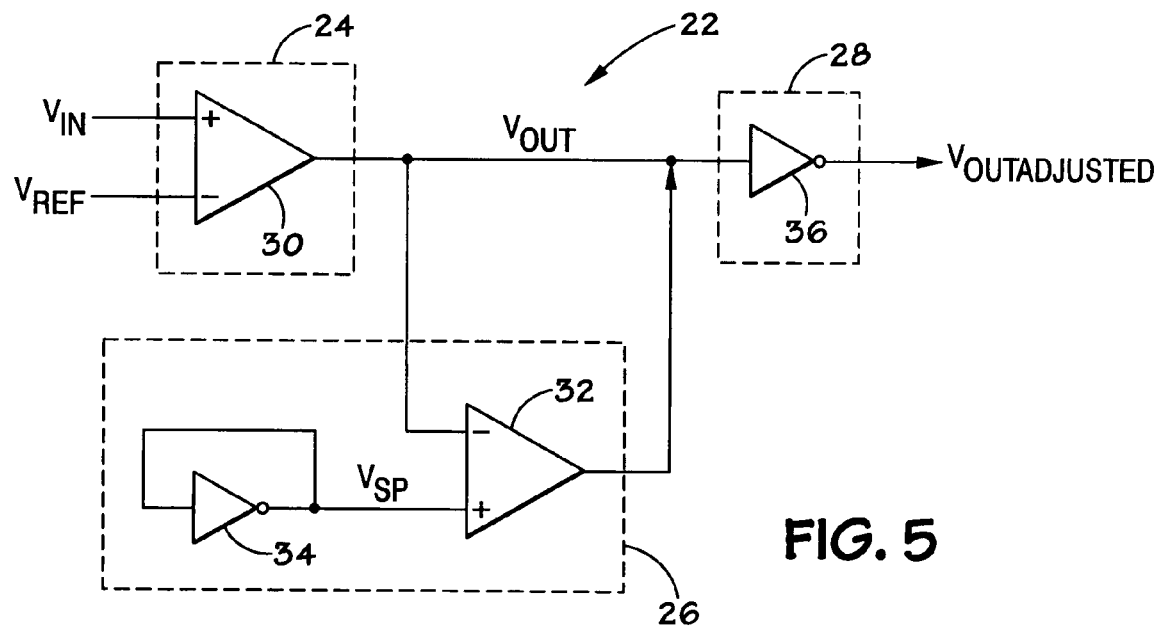
FIG. 5 illustrates a schematic diagram of an exemplary embodiment of the device illustrated in FIG. 4.

FIG. 5 illustrates a schematic diagram of an exemplary embodiment of the device 22 configured in accordance with the present techniques. In the present exemplary embodiment, the input logic 24 comprises a voltage output differential amplifier 30. The differential amplifier 30 receives an input voltage signal $V_{IN}$ at a first input terminal and a second reference voltage signal $V_{REF}$ at a second input terminal. The reference voltage signal $V_{REF}$ may be provided by a controller (not shown), for instance, which may be internal to or external to the high speed device 22. As will be appreciated, the differential amplifier 30 provides a differential output voltage $V_{OUT}$. In order to optimize the output voltage signal $V_{OUT}$ by centering the output voltage signal $V_{OUT}$ about a known voltage, the switching point modulation circuit 26 may be implemented.

In the present exemplary embodiment, the switching point modulation circuit 26 includes a current output differential amplifier 32 and an inverter 34. The input terminal and the output terminal of the inverter 34 are coupled together to provide a switching point voltage signal $V_{SP}$. The switching point voltage signal $V_{SP}$ and the output voltage signal $V_{OUT}$ are combined through the differential amplifier 32. If the output voltage signal $V_{OUT}$ equals the switching point voltage signal $V_{SP}$, then the current produced at the output of the differential amplifier 32 equals zero, indicating that the output voltage signal $V_{OUT}$ is centered around the switching point voltage signal $V_{SP}$. However, if $V_{SP}$ is less than $V_{OUT}$, the current flows back into the output of the differential amplifier 32, thereby stabilizing the voltage on the input of the inverter 34. Once the voltage is stabilized on the input of the inverter 34, the output signal $V_{OUT}$ will be adjusted such that it is centered about the switching point voltage signal $V_{SP}$. As will be appreciated, in accordance with the present exemplary embodiment, the adjusted output voltage signal $V_{OUTADJUSTED}$ having a 50% duty cycle due to the centering of the output voltage signal $V_{OUT}$ about the switching point voltage signal $V_{SP}$ will result.

Finally the output logic 28 may be implemented to generate a full logic signal from the adjusted output voltage signal $V_{OUTADJUSTED}$. In the present exemplary embodiment, the output logic 28 comprises an inverter 36.

Figure 6:
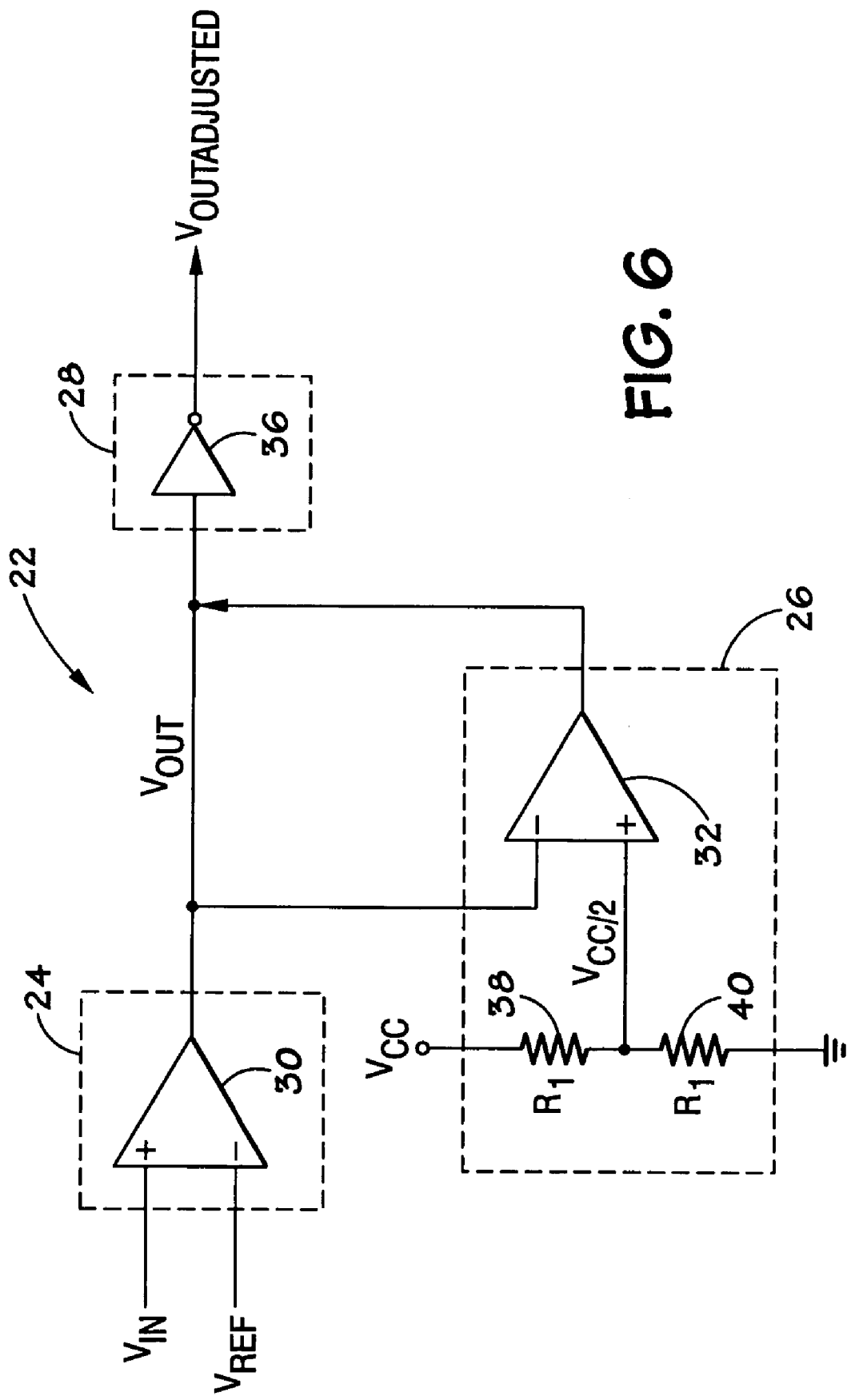
FIG. 6 illustrates a schematic diagram of an alternate exemplary embodiment of the device illustrated in FIG. 4.

As previously described, while many applications may be optimized by providing an output voltage signal with a 50% duty cycle, any desirable reference voltage may be implemented to adjust the output voltage $V_{OUT}$ from the input logic 24. Referring now to FIG. 6, an alternate exemplary embodiment of the high speed device 22 is illustrated. In the exemplary embodiment illustrated in FIG. 6, the input logic 24 and the output logic 28 are the same as those described with reference to FIG. 5. However, the switching point modulation circuit 26 is provided such that the output voltage signal $V_{OUT}$ is centered about $V_{CC}/2$ Accordingly, the current output differential amplifier 32 receives the output voltage signal $V_{OUT}$ from the input logic 24, as previously described, but receives a second input from a voltage divider circuit including resistors 38 and 40, each resistor having the same resistance. As will be appreciated, the resistors 38 and 40 are coupled together at a first node. The opposing terminal of the first resistor 38 is coupled to a voltage source $V_{CC}$ and the opposing terminal of the second resistor 40 is coupled to ground. Accordingly, the coupling node has a resistance of $V_{CC}/2$. Accordingly, the adjusted output voltage $V_{OUTADJUSTED}$ will comprise a voltage logic signal $V_{OUT}$ which is centered around $V_{CC}/2$.

As will be appreciated, alternate voltage producing switching point elements may be implemented along with the current output differential amplifier 32 such that the output voltage $V_{OUT}$ may be adjusted such that it is centered around any desired voltage to produce an adjusted output signal $V_{OUTADJUSTED}$ having no duty cycle distortion resulting from slow slewing input signals. Further, it should be evident that the differential amplifier 30 illustrated herein comprises only one exemplary embodiment of the input logic 24. The switching point modulation circuit 26 may be implemented in conjunction with any input logic 24 which may produce a high speed signal that may suffer duty cycle distortion due of the high speed signal.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device comprising:
input logic configured to receive a periodic input signal and configured to produce a periodic output signal, wherein the input logic comprises a differential amplifier;
a switching point modulation circuit coupled to the input logic and configured to modulate the periodic output signal such that the periodic output signal is centered about a known switching point voltage signal;
and output logic configured to recieve the modulated periodic output signal and configured to produce a full logic signal.

2. The device, as set forth in claim 1, wherein the switching point modulation circuit comprises:
a switching point voltage element configured to produce the switching point voltage signal; and
a comparator circuit configured to compare the switching point voltage signal to the periodic output signal.

3. The device, as set forth in claim 2, wherein the switching point voltage element comprises an inverter.

4. The device, as set forth in claim 3, wherein an input terminal of the inverter is coupled to an output terminal of the inverter.

5. The device, as set forth in claim 2, wherein the periodic output signal is shifted based on an output of the comparator circuit.

6. The device, as set forth in claim 2, wherein the switching point voltage element comprises a voltage divider.

7. The device, as set forth in claim 2, wherein the comparator circuit comprises a differential amplifier configured to receive the switching point voltage signal and the periodic output signal and configured to produce an output current.

8. A method of manufacturing a high speed device comprising:
providing input logic configured to receive a periodic input signal and configured to produce a periodic output signal, wherein providing the input logic comprises a differential amplifier;
providing a switching point modulation circuit coupled to the input logic and configured to modulate the periodic output signal such that the periodic output signal is centered about a known switching point voltage signal; and providing ouput logic configured to recieve the modulated periodic output signal and configured to produce a full logic signal.

9. The method of manufacturing a high speed device, as set forth in claim 8, wherein providing the switching point modulation circuit comprises:
providing a switching point voltage element configured to produce the switching point voltage signal; and
providing a comparator circuit configured to compare the switching point voltage signal to the periodic output signal.

10. The method of manufacturing a high speed device, as set forth in claim 9, wherein providing the switching point voltage element comprises providing an inverter.

11. The method of manufacturing a high speed device, as set forth in claim 10, wherein providing the inverter comprises providing the inverter having an input terminal of the inverter coupled to an output terminal of the inverter.

12. The method of manufacturing a high speed device, as set forth in claim 9, wherein providing the switching point voltage element comprises providing a voltage divider.

13. The method of manufacturing a high speed device, as set forth in claim 9, wherein providing the comparator circuit comprises providing a differential amplifier configured to receive the switching pint voltage signal and the periodic output signal and configured to produce an output current.

* * * * *